US012581962B2

(12) United States Patent (10) Patent No.: US 12,581,962 B2
Nishihara (45) Date of Patent: Mar. 17, 2026

(54) SEMICONDUCTOR DEVICE

(71) Applicant: SHINKO ELECTRIC INDUSTRIES CO., LTD., Nagano (JP)

(72) Inventor: Yoichi Nishihara, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 399 days.

(21) Appl. No.: 18/491,911

(22) Filed: Oct. 23, 2023

(65) Prior Publication Data

US 2024/0145352 A1 May 2, 2024

(30) Foreign Application Priority Data

Oct. 27, 2022 (JP) ................................. 2022-171948

(51) Int. Cl.
  *H01L 23/495* (2006.01)
  *H01L 23/00* (2006.01)
  *H01L 23/31* (2006.01)
(52) U.S. Cl.
  CPC .... *H01L 23/49548* (2013.01); *H01L 23/3107* (2013.01); *H01L 23/49544* (2013.01); *H01L 23/49551* (2013.01); *H01L 24/32* (2013.01); *H01L 2224/32225* (2013.01); *H01L 2224/32245* (2013.01); *H01L 2924/13091* (2013.01)
(58) Field of Classification Search
  CPC ........... H01L 23/49548; H01L 23/3107; H01L 24/32; H01L 2224/32225; H01L 2224/32245; H01L 2924/13091; H01L 23/3121; H01L 23/482; H01L 23/13;

H01L 24/29; H01L 24/83; H01L 23/49541; H01L 23/49544; H01L 23/49551; H01L 23/49555
See application file for complete search history.

(56) References Cited

U.S. PATENT DOCUMENTS 7,928,553 B2 * 4/2011 Otremba ................. H01L 24/97
                                                      438/622
2007/0235810 A1 10/2007 Delgado et al.
2008/0048342 A1 * 2/2008 Cheah ............... H01L 23/49524
                                                      257/777

(Continued)

*Primary Examiner* — Yara B Green
*Assistant Examiner* — Akhee Sarker-Nag
(74) *Attorney, Agent, or Firm* — IPUSA, PLLC

(57) ABSTRACT

A semiconductor device includes a laminate including a semiconductor element, an insulating substrate on a first surface of the semiconductor element, an interconnect on the insulating substrate, and an interconnect member on a second surface of the semiconductor element. The interconnect is electrically connected to a first electrode in the first surface of the semiconductor element through a through hole in the insulating substrate. The interconnect member is electrically connected to a second electrode in the second surface of the semiconductor element. The semiconductor device further includes first and second elastic terminals holding the laminate therebetween. The first terminal includes a bulge that engages with a depression in the interconnect. The second terminal contacts the interconnect member. The semiconductor device further includes a fixing member fixing the first terminal and the second terminal while electrically isolating the first terminal and the second terminal from each other.

11 Claims, 6 Drawing Sheets

(56)     References Cited

U.S. PATENT DOCUMENTS

| | | | |
|---|---|---|---|
| 2009/0129028 A1* | 5/2009 | Son | ..................... H01L 23/4334 |
| | | | 257/723 |
| 2015/0255418 A1* | 9/2015 | Gowda | ................... H01L 24/19 |
| | | | 438/118 |
| 2021/0358835 A1* | 11/2021 | Inokuchi | ................ H01L 23/48 |
| 2024/0079291 A1* | 3/2024 | Nakano | .............. H01L 23/3121 |

* cited by examiner

SEMICONDUCTOR DEVICE

CROSS-REFERENCE TO RELATED APPLICATION

This application is based upon and claims priority to Japanese Patent Application No. 2022-171948, filed on Oct. 27, 2022, the entire contents of which are incorporated herein by reference.

FIELD

A certain aspect of the embodiments discussed herein is related to semiconductor devices.

BACKGROUND

A semiconductor device having a semiconductor element attached to a resin film of polyimide or the like via an adhesive layer and an interconnect formed on the opposite side of the resin film from the adhesive layer has been known (see, for example, U.S. Pat. No. 8,049,338). A terminal of a bus bar or the like is soldered to the interconnect of this semiconductor device.

SUMMARY

According to an embodiment of the present disclosure, a semiconductor device includes a laminate including a semiconductor element, an insulating substrate on a first surface of the semiconductor element, an interconnect on the insulating substrate, and an interconnect member on a second surface of the semiconductor element. The interconnect is electrically connected to a first electrode in the first surface of the semiconductor element through a through hole in the insulating substrate. The interconnect member is electrically connected to a second electrode in the second surface of the semiconductor element. The semiconductor device further includes first and second elastic terminals holding the laminate therebetween. The first terminal includes a bulge that engages with a depression in the interconnect. The second terminal contacts the interconnect member. The semiconductor device further includes a fixing member fixing the first terminal and the second terminal while electrically isolating the first terminal and the second terminal from each other.

The object and advantages of the embodiment will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
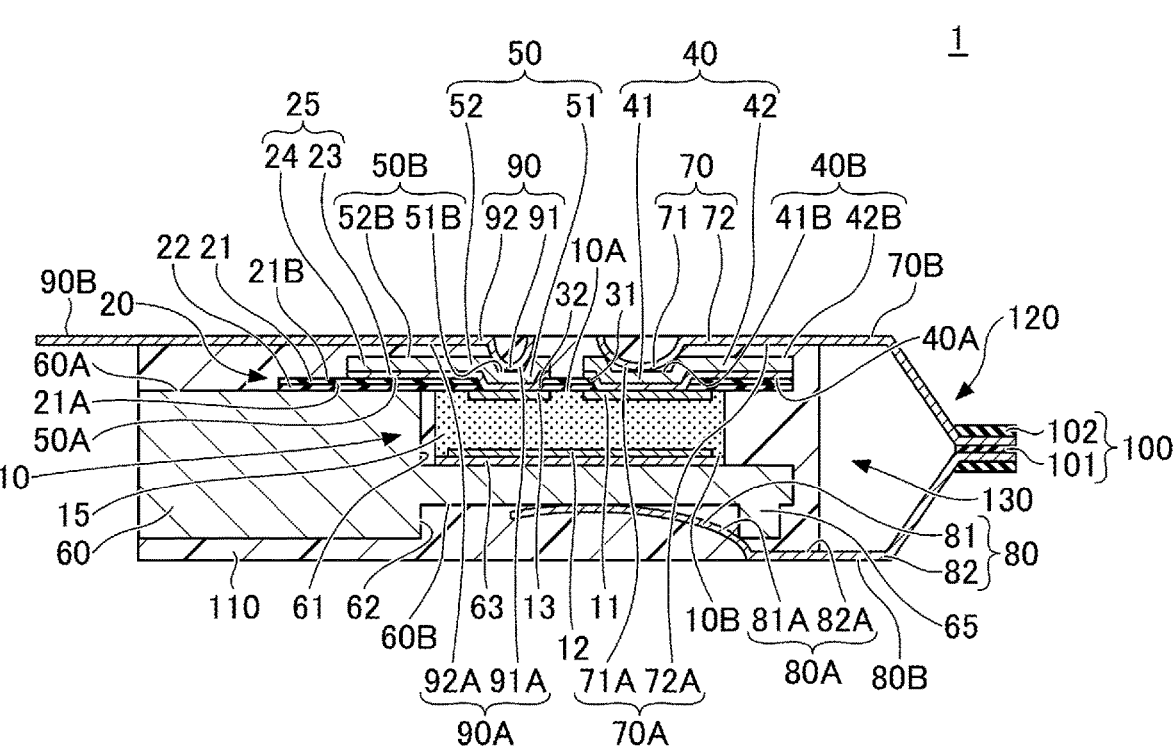
FIG. 1 is a sectional view of a semiconductor device according to an embodiment.
Figure 1:
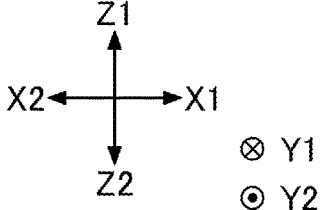

According to the semiconductor device as discussed above, solder that connects the interconnect and the terminal may include a void. The void reduces connection reliability.

According to an embodiment, a semiconductor device that can obtain good connection reliability is provided.

An embodiment of the present disclosure is described in detail below with reference to the accompanying drawings. In the following description and the drawings, the same constituent elements having substantially the same functional configuration may be referred to using the same reference numeral, and a duplication description thereof may be omitted. Furthermore, according to the present disclosure, a Cartesian coordinate system for a three-dimensional space consisting of an X-axis line, a Y-axis line, and a Z-axis line that are orthogonal to one another is employed to describe the position and the configuration of an object such as a constituent element with the origin being at the center of the constituent element. X1 and X2 represent opposite directions along the X-axis line, which directions may be collectively referred to as "X1-X2 direction." Y1 and Y2 represent opposite directions along the Y-axis line, which directions may be collectively referred to as "Y1-Y2 direction." Z1 and Z2 represent opposite directions along the Z-axis line, which directions may be collectively referred to as "Z1-Z2 direction." A plane including the X1-X2 direction and the Y1-Y2 direction is referred to as "XY plane." A plane including the Y1-Y2 direction and the Z1-Z2 direction is referred to as "YZ plane." A plane including the Z1-Z2 direction and the X1-X2 direction is referred to as "ZX plane." For convenience, the Z1-Z2 direction is defined as vertical directions with the Z1 side being an upper side and the Z2 side being a lower side. Furthermore, a plan view refers to a view of an object from the Z1 side, and a planar shape refers to the shape of an object as viewed from the Z1 side. A semiconductor device, however, may be used in an inverted position and may be oriented at any angle.

[Configuration of Semiconductor Device]

First, a sectional configuration of a semiconductor device according to the embodiment is described. FIG. 1 is a sectional view of a semiconductor device according to the embodiment.

Referring to FIG. 1, a semiconductor device 1 according to the embodiment includes a semiconductor element 10 and a flexible printed circuit 20. For example, a device using silicon (Si) or silicon carbide (SiC) may be employed as the semiconductor element 10. For example, a device using gallium nitride (GaN) or gallium arsenide (GaAs) may also be employed as the semiconductor element 10. Examples of the semiconductor element 10 may include semiconductor elements serving as active elements (for example, a silicon chip such as a central processing unit (CPU)), insulated gate bipolar transistors (IGBTs), metal-oxide-semiconductor field-effect transistors (MOSFETs), and diodes. The semiconductor element 10 has electrodes provided on its top surface and bottom surface. The planar shape of the semiconductor element 10 may be any shape and of any size. For example, the planar shape of the semiconductor element 10 is rectangular. The thickness of the semiconductor element 10 may be, for example, approximately 50 μm to approximately 500 μm.

The semiconductor element 10 has a first surface 10A and a second surface 10B on the opposite side from (facing away from) the first surface 10A. Furthermore, the semiconductor element 10 includes a body 15, an electrode 11, an electrode 12, and an electrode 13. The electrodes 11 and 13 are provided in the first surface 10A, and the electrode 12 is provided in the second surface 10B. For example, the electrode 11, the electrode 12, and the electrode 13 may serve as a source electrode, a drain electrode, and a gate electrode, respectively.

Examples of materials that may be used for the electrodes 11, 12 and 13, which may be hereinafter collectively referred to as "electrode," include metals such as aluminum (Al) and copper (Cu) and alloys containing at least one type of metal selected from the aforementioned metals. A surface treatment layer may be formed on a surface of the electrode on an as-needed basis. Examples of surface treatment layers may include a gold (Au) layer, a nickel (Ni)/Au layer (a laminated metal layer of a Ni layer and a Au layer that are stacked in this order), and a Ni/palladium (Pd)/Au layer (a laminated metal layer of a Ni layer, a Pd layer, and a Au layer that are stacked in this order). Examples of these Au layer, Ni layer and Pd layer may include a metal layer formed by electroless plating (an electroless plating metal layer). The Au layer is a metal layer formed of Au or a Au alloy. The Ni layer is a metal layer formed of Ni or a Ni alloy. The Pd layer is a metal layer formed of Pd or a Pd alloy.

The flexible printed circuit 20 includes an insulating substrate 21, an insulating adhesive layer 22, and a wiring layer 25. The insulating substrate 21 has a first surface 21A and a second surface 21B on the opposite side from (facing away from) the first surface 21A. The adhesive layer 22 is provided on the first surface 21A, and the wiring layer 25 is provided on the second surface 21B. The adhesive layer 22 may be provided on the entirety of the first surface 21A. The wiring layer 25 is stacked on the second surface 21B. The wiring layer 25 includes a seed layer 23 and a metal layer 24.

For example, a resin film or the like may be used as the insulating substrate 21. Insulating resins such as polyimide resins, polyethylene reins, and epoxy resins may be used as materials for the resin film. The insulating substrate 21 has, for example, flexibility. Here, flexibility refers to the property of being able to bend or flex. The planar shape of the insulating substrate 21 may be any shape and of any size. For example, the planar shape of the insulating substrate 21 is rectangular. The thickness of the insulating substrate 21 may be, for example, approximately 50 to approximately 100 μm.

The semiconductor element 10 is bonded to the first surface 21A of the insulating substrate 21 with the adhesive layer 22. The first surface 10A of the semiconductor element 10 faces the first surface 21A of the insulating substrate 21. A through hole 31 that exposes the electrode 11 and a through hole 32 that exposes the electrode 13 are formed in the insulating substrate 21 and the adhesive layer 22. The first surface 21A of the insulating substrate 21 contacts the first surface 10A of the semiconductor element 10 via the adhesive layer 22. In other words, the adhesive layer 22 is interposed between the insulating substrate 21 and the semiconductor element 10. According to the present disclosure, contacting an object via an adhesive layer or an electrically conductive adhesive layer may be simply described as "contacting an object."

Examples of materials that may be used for the adhesive layer 22 include epoxy, polyimide, and silicone adhesives. The thickness of the adhesive layer 22 may be, for example, approximately 20 μm to approximately 40 μm.

Multiple pairs of the electrode 11 and the through hole 31 may be provided. As many pairs of the electrode 13 and the through hole 32 as the pairs of the electrode 11 and the through hole 31 may be provided.

The wiring layer 25 includes an interconnect 40 connected to the electrode 11 through the through hole 31 and an interconnect 50 connected to the electrode 13 through the through hole 32.

The interconnect 40 includes a via interconnect 41 filling in the through hole 31 and an interconnect pattern 42 formed on the second surface 21B of the insulating substrate 21. The interconnect 40 includes a first surface 40A and a second surface 40B on the opposite side from (facing away from) the first surface 40A. The first surface 40A of the interconnect 40 contacts the second surface 21B of the insulating substrate 21, the inner surface of the through hole 31 (namely, a surface 21a of the insulating substrate 21 and a surface 22a of the adhesive layer 22 exposed in the through hole 31 (see FIG. 3C)), and a surface 11a of the electrode 11 exposed in the through hole 31 (see FIG. 3C). The second surface 40B of the interconnect 40 includes a surface 41B of the via interconnect 41 and a surface 42B of the interconnect pattern 42. The surface 41B of the via interconnect 41 is a depressed surface, being depressed toward the semiconductor element 10 relative to the surface 42B of the interconnect pattern 42 in such a manner as to enter the through hole 31. The via interconnect 41 is depressed toward the semiconductor element 10. The via interconnect 41 is an example of "a depression."

The interconnect 50 includes a via interconnect 51 filling in the through hole 32 and an interconnect pattern 52 formed on the second surface 21B of the insulating substrate 21. The interconnect 50 includes a first surface 50A and a second surface 50B on the opposite side from (facing away from) the first surface 50A. The first surface 50A of the interconnect 50 contacts the second surface 21B of the insulating substrate 21, the inner surface of the through hole 32 (namely, the surface 21a of the insulating substrate 21 and the surface 22a of the adhesive layer 22 exposed in the through hole 32 (see FIG. 3C)), and a surface 13a of the electrode 13 exposed in the through hole 32 (see FIG. 3C). The second surface 50B of the interconnect 50 includes a surface 51B of the via interconnect 51 and a surface 52B of the interconnect pattern 52. The surface 51B of the via interconnect 51 is a depressed surface, being depressed toward the semiconductor element 10 relative to the surface 52B of the interconnect pattern 52 in such a manner as to enter the through hole 32. The via interconnect 51 is depressed toward the semiconductor element 10.

The seed layer 23 covers the second surface 21B of the insulating substrate 21 and the inner surfaces of the through holes 31 and 32. The seed layer 23 is famed to continuously cover the second surface 21B of the insulating substrate 21, the inner surfaces of the through holes 31 and 32, and the surfaces 11a and 13a of the electrodes 11 and 13 exposed at the bottom of the through holes 31 and 32. A metal film formed by sputtering (sputtering film) may be used as the seed layer 23. For example, the seed layer 23 formed by sputtering may be a two-layer metal film having a titanium (Ti) layer formed of titanium and a Cu layer formed of copper stacked in this order on the second surface 21B of the insulating substrate 21 and the inner surfaces of the through holes 31 and 32. In this case, the thickness of the Ti layer may be, for example, approximately 10 nm to approximately 300 nm, and the thickness of the Cu layer may be, for example, approximately 100 nm to approximately 1000 nm. The Ti layer serves as an adhesion layer to increase the adhesion between the insulating substrate 21, the electrodes 11 and 13, etc., and the seed layer 23. The Ti layer also serves as a metal barrier layer to prevent the diffusion of copper from the Cu layer, etc., into the insulating substrate 21, etc. Examples of materials that may be used for such a metal film serving as an adhesion layer and a metal barrier layer include, in addition to titanium, titanium nitride (TiN), tantalum nitride (TaN), tantalum (Ta), and chromium (Cr).

Examples of materials that may be used for the metal layer 24 include copper and copper alloys. For example, the metal layer 24 may be a metal layer famed by electroplating (an electroplating metal layer).

The semiconductor device 1 further includes a lead terminal 60, a press-fit terminal 70, a press-fit terminal 80, a press-fit terminal 90, a fixing member 100, and an encapsulation material 110.

The lead terminal 60 is formed of, for example, a lead frame. Examples of materials of the lead terminal 60 include copper. The electrode 12 of the semiconductor element 10 is joined to the lead terminal 60 with a conductive (electrically conductive) adhesive layer 63. The lead terminal 60 has a first surface 60A and a second surface 60B on the opposite side from (facing away from) the first surface 60A. A depression 61 is formed in the first surface 60A of the lead terminal 60. The depression 61 is formed by, for example, half etching. The depth of the depression 61 is equal or approximately equal to the sum of the thickness of the semiconductor element 10 and the thickness of the conductive adhesive layer 63. The semiconductor element 10 is accommodated in the depression 61 to be mounted on the lead terminal 60. A depression 62 is famed in the second surface 60B of the lead terminal 60. The depression 62 is formed by, for example, half etching. The depression 62 is positioned over the semiconductor element 10 in a plan view. The conductive adhesive layer 63 is, for example, a solder layer or a sintered metal layer. The conductive adhesive layer 63 may be famed of electrically conductive paste. The first surface 60A of the lead terminal 60 contacts the second surface 10B of the semiconductor element 10 via the conductive adhesive layer 63. The lead terminal 60 is an example of "an interconnect member." The depression 61 is an example of "another depression." The depression 62 is an example of "a depression."

The lead terminal 60 is provided to be enclosed in (covered by) the encapsulation material 110. Part of the lead terminal 60 may be exposed outside the encapsulation material 110. The second surface 60B of the lead terminal 60 is depressed to form the depression 62 whose periphery is partly defined by an elevated rim or protrusion 65. A side surface of the protrusion 65 defines an inner surface of the depression 62. The presence of the protrusion 65 prevents the press-fit terminal 80 from being displaced. Furthermore, the presence of the protrusion 65 increases the surface area of contact between the lead terminal 60 and the encapsulation material 110 to make it possible to increase encapsulation strength. Furthermore, the first surface 60A of the lead terminal 60 may also protrude on the X1 side of the depression 61 to form a protrusion to define the depression 61, although no such protrusion is depicted in FIG. 1.

The press-fit terminal 70 is metallic and elastic. Examples of materials for the press-fit terminal 70 include copper. The press-fit terminal 70 includes a bowl-shaped (concave) portion 71 and a base 72 extending from the bowl-shaped portion 71. The press-fit terminal 70 has a first surface 70A and a second surface 70B on the opposite side from (facing away from) the first surface 70A. The first surface 70A of the press-fit terminal 70 includes a surface 71A of the bowl-shaped portion 71 and a surface 72A of the base 72. The surface 71A of the bowl-shaped portion 71 is a convex surface that bulges toward the semiconductor element 10 relative to the surface 72A of the base 72. The bowl-shaped portion 71 bulges or protrudes toward the semiconductor element 10. The surface 71A of the bowl-shaped portion 71 contacts the surface 41B of the via interconnect 41, and the bowl-shaped portion 71 engages with the concave via interconnect 41 to contact the interconnect 40. The press-fit terminal 70 is an example of "a first terminal" and the bowl-shaped portion 71 is an example of "a bulge."

The press-fit terminal 80 is metallic and elastic. Examples of materials for the press-fit terminal 80 include copper. The press-fit terminal 80 includes a bowl-shaped (concave) portion 81 and a base 82 extending from the bowl-shaped portion 81. The press-fit terminal 80 has a first surface 80A and a second surface 80B on the opposite side from (facing away from) the first surface 80A. The first surface 80A of the press-fit terminal 80 includes a surface 81A of the bowl-shaped portion 81 and a surface 82A of the base 82. The surface 81A of the bowl-shaped portion 81 is a convex surface that bulges toward the semiconductor element 10 relative to the surface 82A of the base 82. The bowl-shaped portion 81 bulges or protrudes toward the semiconductor element 10. The surface 81A of the bowl-shaped portion 81 contacts the second surface 60B of the lead terminal 60, and the bowl-shaped portion 81 engages with the depression 62 to contact the lead terminal 60. The press-fit terminal 80 is an example of "a second terminal" and the bowl-shaped portion 81 is an example of "a bulge."

The base 72 of the press-fit terminal 70 and the base 82 of the press-fit terminal 80 extend substantially parallel to each other in the X1 direction relative to the semiconductor element 10. The fixing member 100 fixes the press-fit terminals 70 and 80 while electrically isolating the press-fit terminals 70 and 80 from each other. The fixing member 100 includes an insulation member 101 and a tightening member 102. The insulation member 101 is interposed between the opposite end of the base 72 from the bowl-shaped portion 71 and the opposite end of the base 82 from the bowl-shaped portion 81 to contact the surface 72A of the base 72 and the surface 82A of the base 82. For example, a polyimide layer or insulating paper is used as the insulation member 101. The tightening member 102 tightens the press-fit terminal 70, the insulation member 101, and the press-fit terminal 80 together while pinching the press-fit terminal 70, the insulation member 101, and the press-fit terminal 80. Examples of the tightening member 102 include an insulating bolt and nut.

The press-fit terminal 90 is metallic and elastic. Examples of materials for the press-fit terminal 90 include copper. The press-fit terminal 90 includes a bowl-shaped (concave) portion 91 and a base 92 extending from the bowl-shaped portion 91. The press-fit terminal 90 has a first surface 90A and a second surface 90B on the opposite side from (facing away from) the first surface 90A. The first surface 90A of the press-fit terminal 90 includes a surface 91A of the bowl-shaped portion 91 and a surface 92A of the base 92. The surface 91A of the bowl-shaped portion 91 is a convex surface that bulges toward the semiconductor element 10 relative to the surface 92A of the base 92. The bowl-shaped portion 91 bulges or protrudes toward the semiconductor element 10. The surface 91A of the bowl-shaped portion 91 contacts the surface 51B of the via interconnect 51, and the bowl-shaped portion 91 engages with the concave via interconnect 51 to contact the interconnect 50. The base 92 of the press-fit terminal 90 extends in the X2 direction relative to the semiconductor element 10.

The press-fit terminals 70 and 80 are fixed by the fixing member 100 to constitute a terminal member 120. According to the terminal member 120, the distance (gap) between the surface 71A of the bowl-shaped portion 71 and the surface 81A of the bowl-shaped portion 81 is greater (wider) in the state where a laminate 130 including the lead terminal 60, the conductive adhesive layer 63, the semiconductor element 10, the adhesive layer 22, the insulating substrate 21, and the interconnect 40 is provided between the surfaces 71A and 81A than in the state where the press-fit terminals 70 and 80 are not elastically deformed without the laminate 130. Accordingly, with the laminate 130 interposed between the surface 71A of the bowl-shaped portion 71 and the surface 81A of the bowl-shaped portion 81, the press-fit terminals 70 and 80 hold the laminate 130 between the press-fit terminals 70 and 80 in the direction of lamination with their elasticity.

The encapsulation material 110 encapsulates the laminate 130 and the press-fit terminals 70, 80 and 90. The encapsulation material 110 encapsulates at least the area of contact between the press-fit terminal 70 and the interconnect 40 and the area of contact between the press-fit terminal 80 and the lead terminal 60. Examples of materials used for the encapsulation material 110 include mold resin and underfill resin.

The electrode 11 of the semiconductor element 10 is electrically connected to the press-fit terminal 70. The electrode 12 of the semiconductor element 10 is electrically connected to the lead terminal 60 and the press-fit terminal 80. The electrode 13 of the semiconductor element 10 is electrically connected to the press-fit terminal 90.

Figure 2:
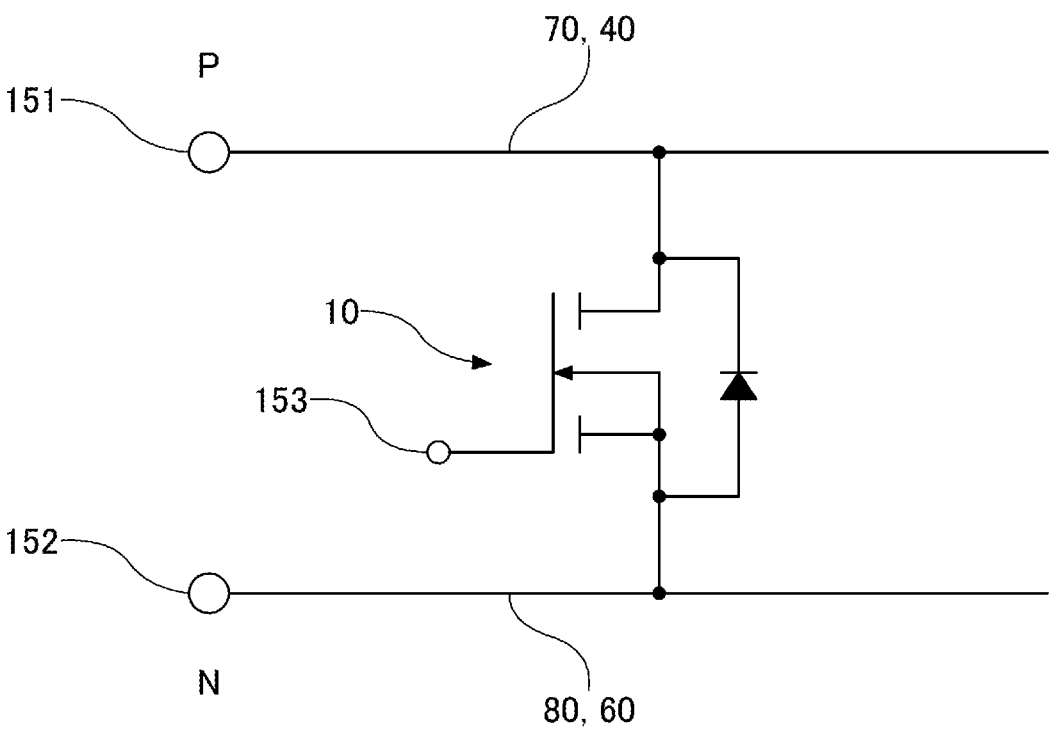
FIG. 2 is a circuit diagram illustrating the semiconductor device according to the embodiment.

Here, a circuit configuration of the semiconductor device 1 according to the embodiment is described with reference to FIG. 2. FIG. 2 is a circuit diagram illustrating a semiconductor device according to the embodiment.

The electrode 11 of the semiconductor element 10 is electrically connected to a P terminal 151 via the press-fit terminal 70. The electrode 12 of the semiconductor element 10 is electrically connected to an N terminal 152 via the lead terminal 60 and the press-fit terminal 80. The electrode 13 of the semiconductor element is electrically connected to a control terminal 153 via the press-fit terminal 90. The P terminal 151 is a positive input terminal, and the N terminal 152 is a negative input terminal. Accordingly, electric current flows through the press-fit terminals 70 and 80 in opposite directions from each other.

[Method of Manufacturing Semiconductor Device]

Next, a method of manufacturing a semiconductor device according to the embodiment is described. FIGS. 3A through 3H are sectional views illustrating a method of manufacturing a semiconductor device according to the embodiment. By way of example, in the following, a so-called multi-piece manufacturing method, namely, manufacturing parts each to become a composite of the semiconductor element 10 and the flexible printed circuit all together and thereafter separating the parts into individual pieces to manufacture multiple composites, is described. For convenience of description, parts to ultimately become constituent elements of the semiconductor device 1 are referred to using the reference numerals of the final constituent elements.

Figure 3A:
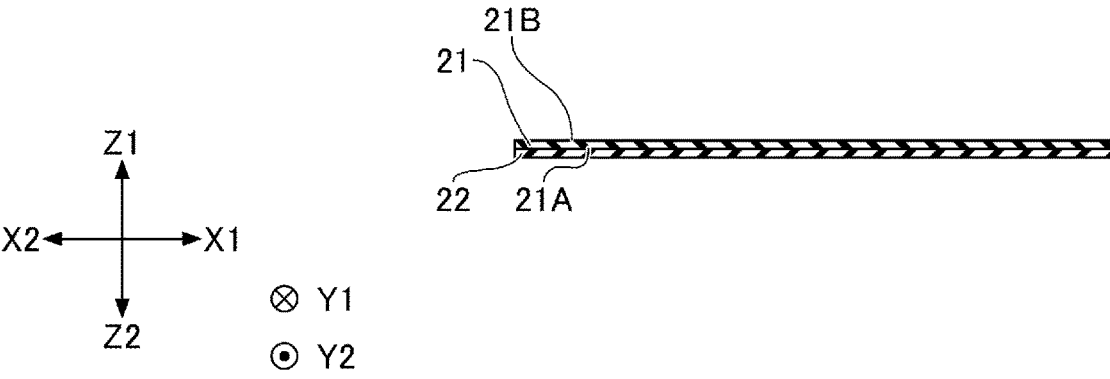
FIGS. 3A through 3H are sectional views illustrating a method of manufacturing a semiconductor device according to the embodiment.

First, as illustrated in FIG. 3A, the large-size insulating substrate 21 having the first surface 21A and the second surface 21B is prepared. In the large-size insulating substrate 21, for example, multiple individual areas in which composites are to be formed are successively provided in a matrix. Here, the individual areas are areas to be ultimately cut along predetermined cutting lines into individual pieces to become individual composites. The number of individual areas of the large-size insulating substrate 21 is not limited in particular. The insulating adhesive layer 22 is provided on the first surface 21A of the insulating substrate 21 to cover the entirety of the first surface 21A.

Figure 3B:
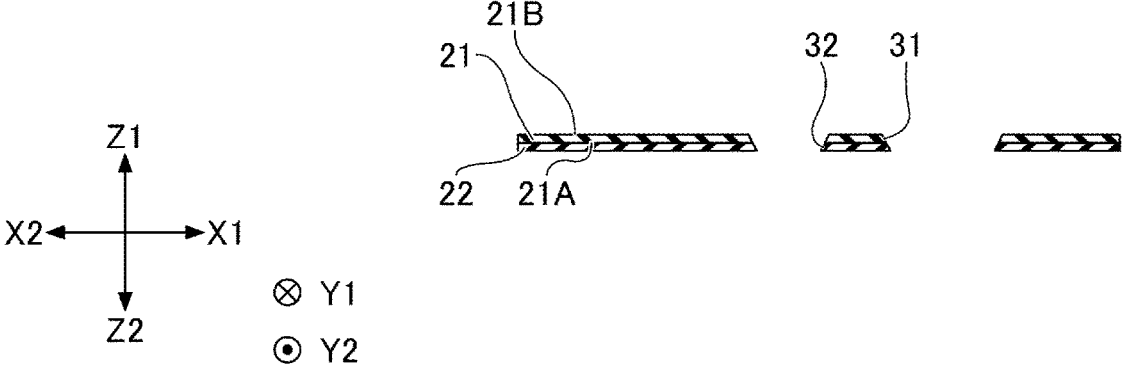

Next, as illustrated in FIG. 3B, the through holes 31 and 32 are formed in the insulating substrate 21 and the adhesive layer 22 at predetermined positions to pierce through the insulating substrate 21 and the adhesive layer 22 in the thickness direction. The through holes 31 and 32 may be formed by, for example, laser processing using a $CO_2$ laser, a UV-YAG laser, or the like or punching. For example, the through hole 31 is formed on the X1 side of the through hole 32.

Figure 3C:
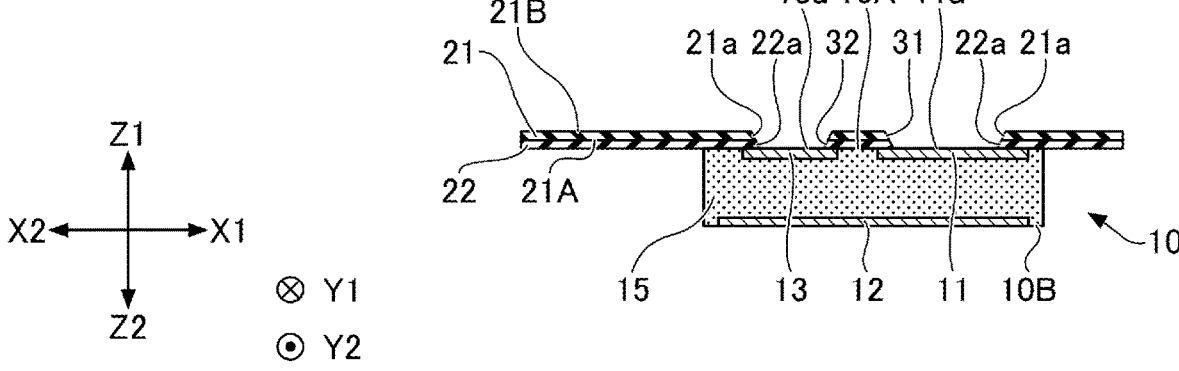

Next, as illustrated in FIG. 3C, the semiconductor element 10 is bonded to the insulating substrate 21 with the adhesive layer 22. At this point, the first surface 10A of the semiconductor element 10 is caused to face the first surface 21A of the insulating substrate 21 and is positioned so that the electrode 11 is over the through hole 31 and the electrode 13 is over the through hole 32 in a plan view.

Figure 3D:
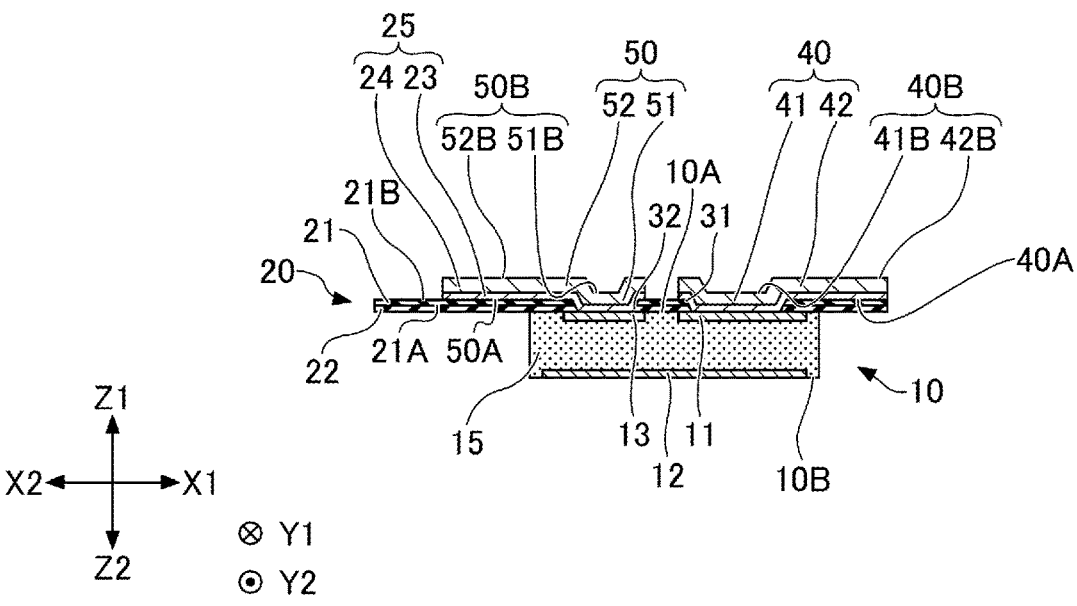

Next, as illustrated in FIG. 3D, the wiring layer 25 including the seed layer 23 and the metal layer 24 is formed on the second surface 21B of the insulating substrate 21. The wiring layer 25 may be formed by, for example, a semi-additive process.

Specifically, the seed layer 23 is formed to cover the entirety of the second surface 21B of the insulating substrate 21 and the entirety of the inner surfaces of the through holes 31 and 32 (namely, the surface 21a of the insulating substrate 21 and the surface 22a of the adhesive layer 22 exposed in the through holes 31 and 32 (see FIG. 3C)). The seed layer 23 may be formed by, for example, sputtering or electroless plating. For example, in the case of forming the seed layer 23 by sputtering, first, a Ti layer is formed by depositing titanium by sputtering to cover the second surface 21B of the insulating substrate 21 and the inner surfaces of the through holes 31 and 32. Thereafter, a Cu layer is formed by depositing copper on the Ti layer by sputtering. Thereby, the seed layer 23 having a two-layer structure (Ti layer/Cu layer) may be formed. In the case of forming the seed layer 23 by electroless plating, for example, the seed layer 23 having a single-layer structure of a Cu layer may be famed by electroless copper plating.

Next, a plating resist layer (not depicted) is formed on the seed layer 23. Openings are formed where the wiring layer 25 is to be formed, namely, where the interconnects 40 and 50 are to be formed, in the plating resist layer. Next, the metal layer 24 of copper or the like is formed in the openings of the plating resist layer on the seed layer 23 by electroplating using the seed layer 23 as a power supply path for plating. Thereafter, the plating resist layer is removed. Next, wet etching is performed on the seed layer 23 using the metal layer 24 as a mask to remove the seed layer 23 not covered by the metal layer 24. The wiring layer 25 including the seed layer 23 and the metal layer 24 may be famed in this manner. The wiring layer 25 includes the interconnects 40 and 50. The insulating substrate 21, the adhesive layer 22, and the wiring layer 25 constitute the flexible printed circuit 20.

Furthermore, the lead terminal 60 is prepared, separately from the flexible printed circuit 20. For example, the lead terminal 60, in which the depression 61 is famed in the first surface 60A and the depression 62 is formed in the second surface 60B by half-etching a metal plate, is prepared. The depth of the depression 61 is equal or approximately equal to the sum of the thickness of the semiconductor element 10 and the thickness of the conductive adhesive layer 63.

Figure 3E:
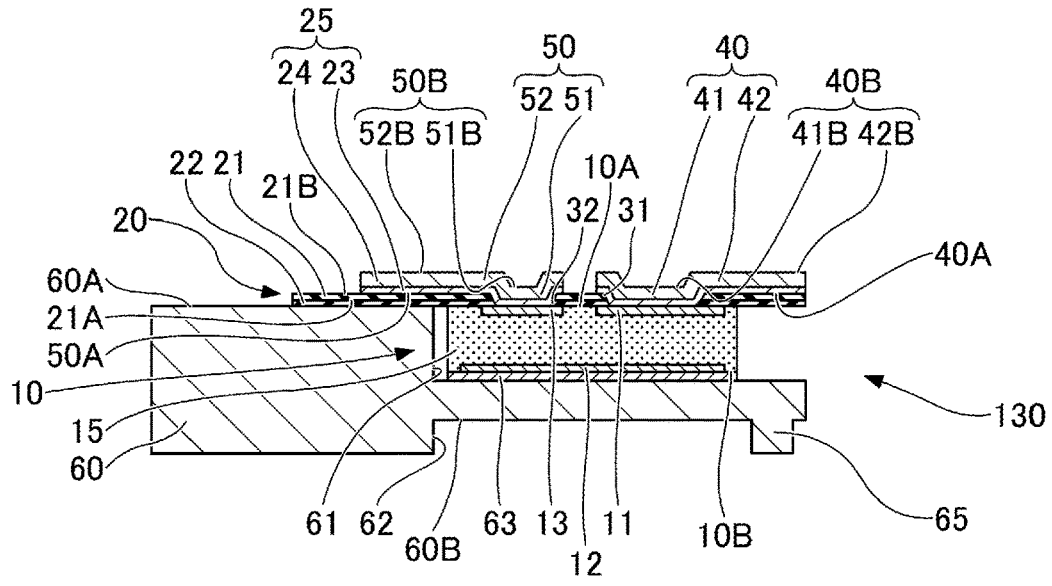
Figure 3E:
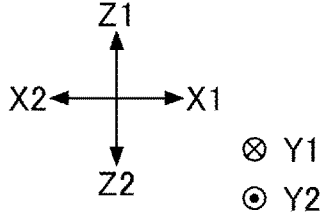

After the formation of the wiring layer 25, the conductive adhesive layer 63 is provided on the second surface 10B of the semiconductor element 10 as illustrated in FIG. 3E. The conductive adhesive layer 63 is uncured. Next, the lead terminal 60 is joined to the electrode 12 with the conductive adhesive layer 63. During this joining, the conductive adhesive layer 63 is cured. Furthermore, the adhesive layer 22 of the flexible printed circuit 20 is placed on the first surface 60A of the lead terminal 60.

In this manner, the laminate 130 may be manufactured. The large-size insulating substrate 21 may be divided, for example, before the provision of the conductive adhesive layer 63 (FIG. 3E) after the formation of the wiring layer 25 (FIG. 3D).

Figure 3F:
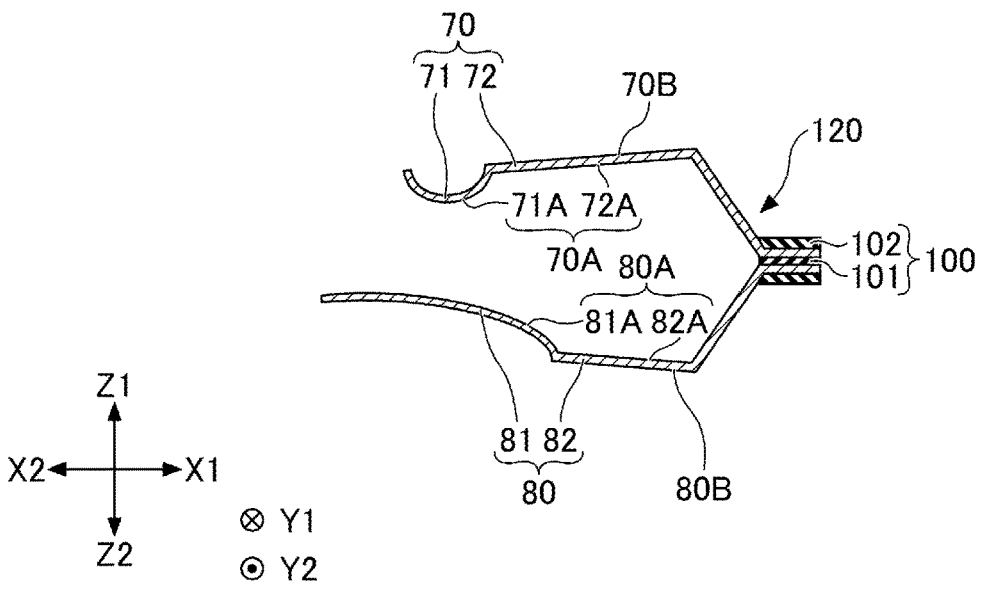

Furthermore, separately from the laminate 130, the terminal member 120 including the press-fit terminals 70 and 80 and the fixing member 100 is prepared as illustrated in FIG. 3F. The press-fit terminal 70 includes the bowl-shaped portion 71 and the base 72 extending from the bowl-shaped portion 71. The press-fit terminal 80 includes the bowl-shaped portion 81 and the base 82 extending from the bowl-shaped portion 81. The distance between the surface 71A of the bowl-shaped portion 71 and the surface 81A of the bowl-shaped portion 81 is smaller in the state where the laminate 130 is not provided between the surface 71A of the bowl-shaped portion 71 and the surface 81A of the bowl-shaped portion 81 than in the state where the laminate 130 is provided.

Figure 3G:
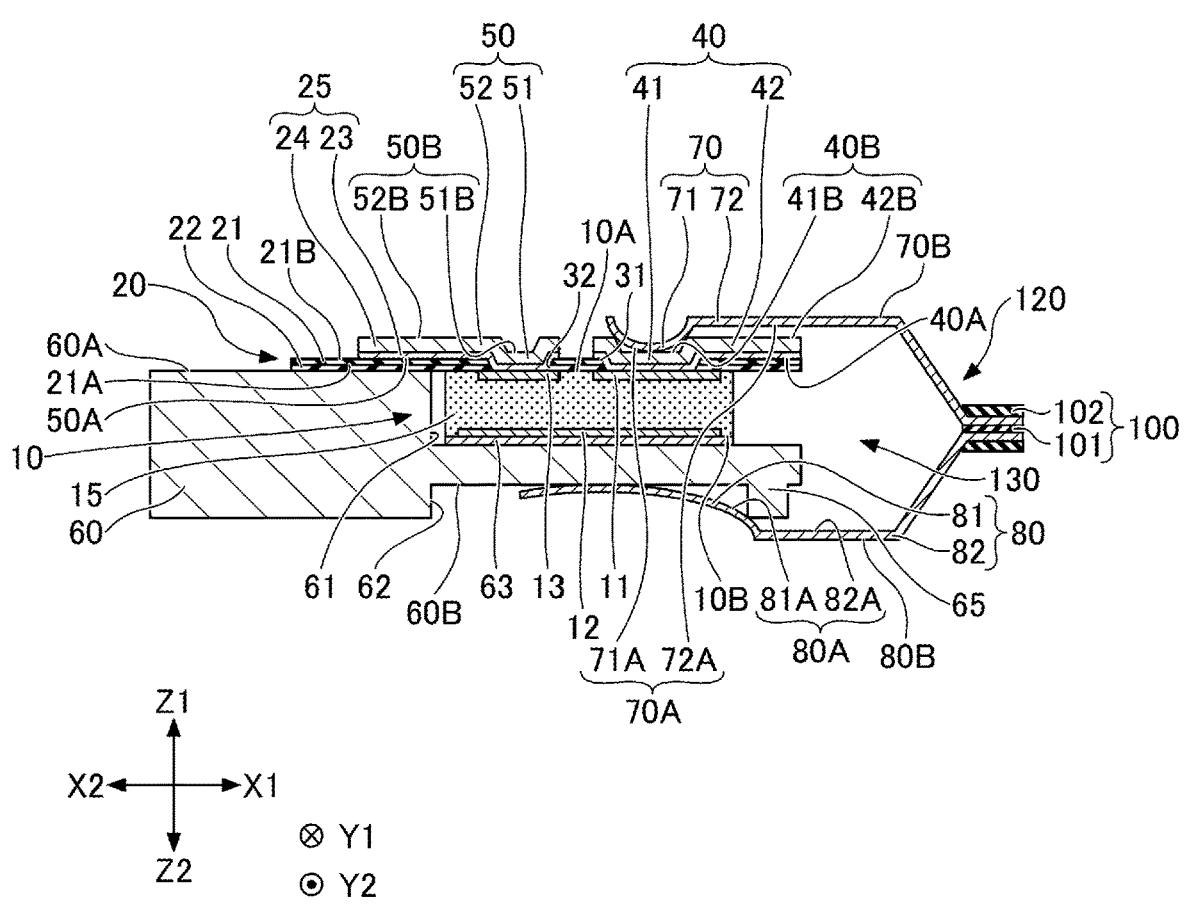

Then, the terminal member 120 is fixed to the laminate 130 as illustrated in FIG. 3G. Specifically, the terminal member 120 is moved toward the laminate 130 from the X1 side of the laminate 130 to cause the surface 71A of the bowl-shaped portion 71 to contact the second surface 40B of the interconnect 40 and cause the surface 81A of the bowl-shaped portion 81 to contact the second surface 60B of the lead terminal 60 while elastically deforming the press-fit terminals 70 and 80. Then, the terminal member 120 is caused to stop moving upon entry of the bowl-shaped portion 71 and the bowl-shaped portion 81 into the concave via interconnect 41 and the depression 62 of the lead terminal 60, respectively. Thus, the bowl-shaped portion 71 engages with the concave via interconnect 41 and the bowl-shaped portion 81 engages with the depression 62.

Figure 3H:
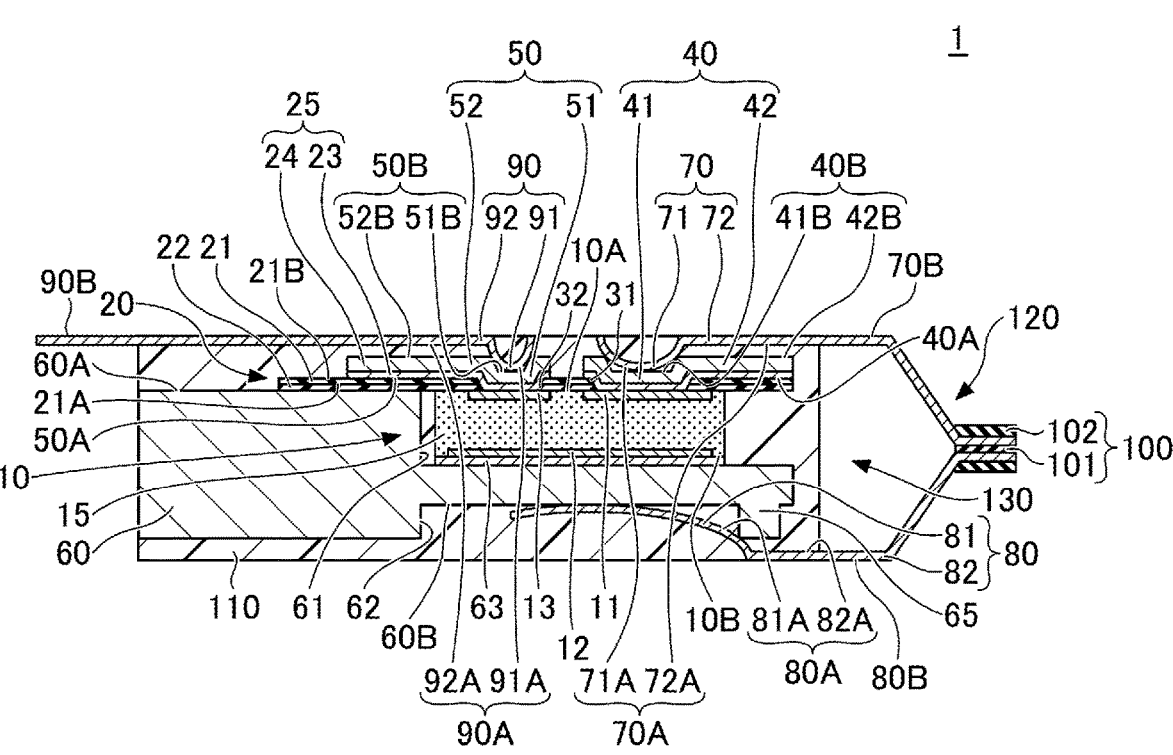
Figure 3H:
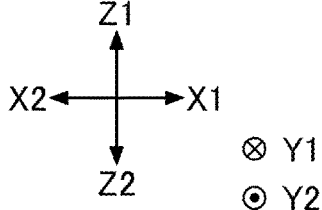

Next, as illustrated in FIG. 3H, encapsulation with the encapsulation material 110 is performed with the press-fit terminal 90 being placed such that the bowl-shaped portion 91 enters the concave via interconnect 51.

The semiconductor device 1 according to the embodiment may be manufactured in this manner.

According to the semiconductor device 1 of the embodiment, the surface 71A of the bowl-shaped portion 71 contacts the surface 41B of the via interconnect 41, and the bowl-shaped portion 71 engages with the concave via interconnect 41 to contact the interconnect 40. Furthermore, the surface 81A of the bowl-shaped portion 81 contacts the second surface 60B of the lead terminal 60, and the bowl-shaped portion 81 engages with the depression 62 to contact the lead terminal 60. The press-fit terminals 70 and 80 hold the laminate 130 therebetween in the direction of lamination with their elasticity. Therefore, the interconnect 40 and the press-fit terminal 70 firmly contact each other, and the lead terminal 60 and the press-fit terminal 80 firmly contact each other. Thus, according to this embodiment, it is possible to achieve good connection reliability. Furthermore, the terminal member 120 can be firmly fixed mechanically to the laminate 130 without using joining material such as solder.

Furthermore, the encapsulation material 110 encapsulates at least the area of contact between the press-fit terminal 70 and the interconnect 40 and the area of contact between the press-fit terminal 80 and the lead terminal 60. Accordingly, the interconnect 40 contacts the press-fit terminal 70 with good stability, and the lead terminal 60 contacts the press-fit terminal 80 with good stability. According to this embodiment, in this respect as well, it is possible to achieve good connection reliability, and it is possible to firmly fix the terminal member 120 mechanically to the laminate 130.

Furthermore, the base 72 of the press-fit terminal 70 and the base 82 of the press-fit terminal 80 extend substantially parallel to each other in the X1 direction as viewed from the semiconductor element 10. Therefore, it is possible to reduce the lengths of the press-fit terminals 70 and 80 to reduce inductance.

Furthermore, when electric current flows from the P terminal 151 to the N terminal 152, the electric current flows from the X2 side to the X1 side in the press-fit terminal 70 and flows from the X1 side to the X2 side in the press-fit terminal 80. Accordingly, loop inductance is possible. Furthermore, according to this embodiment, the distance between the press-fit terminals 70 and 80 is at most approximately equal to the sum of the thickness of the semiconductor element 10, the thickness of the flexible printed circuit 20, and the thickness of a part of the lead terminal 60 where the depression 62 is formed. Accordingly, the magnetic field generated around the press-fit terminal 70 and the magnetic field generated around the press-fit terminal 80 tend to cancel each other out, so that it is possible to reduce inductance.

Furthermore, the wiring layer 25 can be finely formed with high accuracy on the second surface 21B of the insulating substrate 21 by a semi-additive process. This makes it possible to achieve high dimensional accuracy and to facilitate the connection of an external connection terminal or the like. The wiring layer 25 may also be formed on the second surface 21B of the insulating substrate 21 by a subtractive process. Furthermore, bonding the semiconductor element 10 to the first surface 21A of the insulating substrate 21 with the adhesive layer 22 makes it possible to fix the position of the semiconductor element 10 relative to the insulating substrate 21 and the wiring layer 25. Thus, according to this embodiment, it is possible to achieve good positional accuracy and good connection reliability.

The depression 61 in the first surface 60A of the lead terminal 60 is optional. With the depression 61, however, it is possible to reduce the thickness of the entirety of semiconductor device 1.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:

a laminate including a semiconductor element including a first electrode in a first surface thereof and a second electrode in a second surface thereof, the first and second surfaces facing away from each other;

an insulating substrate on the first surface of the semiconductor element, the insulating substrate having a through hole exposing the first electrode;

an interconnect on a surface of the insulating substrate facing away from the semiconductor element, the interconnect being electrically connected to the first electrode through the through hole, the interconnect having a depression depressed toward the semiconductor element in a surface thereof facing away from the semiconductor element; and an interconnect member on the second surface of the semiconductor element, the interconnect member being electrically connected to the second electrode;

a first terminal and a second terminal that are elastic and hold the laminate therebetween in a direction of lamination with elasticity, the first terminal including a bulge that engages with the depression to contact the surface of the interconnect, the second terminal contacting the interconnect member; and a fixing member fixing the first terminal and the second terminal while electrically isolating the first terminal and the second terminal from each other.

2. The semiconductor device as claimed in claim 1, wherein the interconnect member includes a depression depressed toward the semiconductor element in a surface thereof facing away from the semiconductor element, and the second terminal includes a bulge that engages with the depression of the interconnect member to contact the interconnect member.

3. The semiconductor device as claimed in claim 2, further comprising:

a conductive adhesive layer joining the second electrode and the interconnect member together, wherein the interconnect member includes another depression in a surface thereof facing toward the semiconductor element, said another depression having a depth equal to a sum of a thickness of the semiconductor element and a thickness of the conductive adhesive layer, and the semiconductor element is accommodated in said another depression.

4. The semiconductor device as claimed in claim 2, wherein the first terminal and the second terminal include the respective bulges at respective first ends, and the fixing member includes an insulation member interposed between respective second ends of the first terminal and the second terminal opposite from the respective first ends; and

a tightening member tightening the first terminal and the second terminal together by pinching the respective second ends.

5. The semiconductor device as claimed in claim 2, wherein the first terminal and the second terminal elastically deform to widen a gap between the bulge of the first terminal and the bulge of the second terminal to hold the laminate between the first terminal and the second terminal.

6. The semiconductor device as claimed in claim 1, further comprising:

an encapsulation material encapsulating at least an area of contact between the first terminal and the interconnect and an area of contact between the second terminal and the interconnect member.

7. The semiconductor device as claimed in claim 1, wherein electric current flows in a first direction in the interconnect and flows in a second direction opposite from the first direction in the interconnect member.

8. The semiconductor device as claimed in claim 1, wherein the interconnect member includes a lead terminal.

9. The semiconductor device as claimed in claim 1, further comprising:

a conductive adhesive layer joining the second electrode and the interconnect member together.

10. The semiconductor device as claimed in claim 1, further comprising:

an insulating adhesive layer interposed between the insulating substrate and the semiconductor element to bond the insulating substrate and the semiconductor element together.

11. The semiconductor device as claimed in claim 10, wherein the through hole pierces through the insulating adhesive layer, and the interconnect includes a seed layer covering the surface of the insulating substrate and covering a surface of the insulating substrate, a surface of the insulating adhesive layer, and a surface of the first electrode that are exposed in the through hole; and a metal layer on the seed layer.

* * * * *